(12) United States Patent
Takaki et al.

(10) Patent No.: US 8,532,155 B2
(45) Date of Patent: Sep. 10, 2013

(54) OPTICAL INTERCONNECTION SYSTEM

(71) Applicant: Furukawa Electric Co., Ltd., Tokyo (JP)

(72) Inventors: Keishi Takaki, Tokyo (JP); Masaki Funabashi, Tokyo (JP); Yasumasa Kawakita, Tokyo (JP); Naoki Tsukiji, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/733,371

(22) Filed: Jan. 3, 2013

(65) Prior Publication Data

US 2013/0121354 A1  May 16, 2013

Related U.S. Application Data

(63) Continuation of application No. PCT/JP2011/003942, filed on Jul. 8, 2011.

(30) Foreign Application Priority Data

Jul. 9, 2010  (JP) .................................. 2010-157151

(51) Int. Cl.
*H01S 5/00* (2006.01)

(52) U.S. Cl.
USPC .............. 372/50.121; 372/50.124; 372/50.12; 372/50.1

(58) Field of Classification Search
USPC .................... 372/50.121, 50.124, 50.12, 50.1
See application file for complete search history.

(56) References Cited

U.S. PATENT DOCUMENTS

| | | | |
|---|---|---|---|
| 6,804,283 B2 * | 10/2004 | Scherer | 372/50.21 |
| 2003/0103712 A1 | 6/2003 | Glebov et al. | |
| 2006/0013595 A1 * | 1/2006 | Trezza et al. | 398/164 |
| 2007/0280585 A1 | 12/2007 | Warashina et al. | |

FOREIGN PATENT DOCUMENTS

| | | |
|---|---|---|
| JP | 2006-351917 A | 12/2006 |
| JP | 2007-214430 A | 8/2007 |
| WO | 0150164 A1 | 7/2001 |

OTHER PUBLICATIONS

International Search Report corresponding to PCT/JP2011/003942, dated Feb. 24, 2012.
Padullaparthi Babu Dayal et al., "Multiple-Wavelength Vertical-Cavity Surface-Emitting Lasers by Grading a Spacer Layer for Short-Reach Wavelength Division Multiplexing Applications", Appl. Phys. Express 2, Aug. 2009, 092501.

(Continued)

*Primary Examiner* — Kinam Park
(74) *Attorney, Agent, or Firm* — Lowe, Hauptman & Ham, LLC

(57) ABSTRACT

There is provided an optical interconnection system including a plurality of semiconductor integrated devices each including a surface emitting laser array device including a plurality of surface emitting laser devices each emitting an output laser signal light of a different wavelength modulated based on an input modulated signal, a silicon optical waveguide that guides output laser signal lights emitted from the surface emitting laser devices of each of the semiconductor integrated devices to another semiconductor integrated device, a plurality of optical couplers respectively corresponding to the semiconductor integrated devices and guiding the output laser signal lights to the silicon optical waveguide, and a plurality of optical splitters respectively corresponding to the semiconductor integrated devices, receiving the output laser signal lights guided by the silicon optical waveguide, and inputting an input laser signal light to a corresponding one of the semiconductor integrated devices.

12 Claims, 8 Drawing Sheets

(56) References Cited

OTHER PUBLICATIONS

Tei-ichi Suzuki et al., "Monolithic Multiple-Wavelength VCSEL Prototype for High-Density CWDM", IEICE technical report, vol. 107, No. 198, OPE 2007-86, pp. 101-106, Aug. 8, 2007.

B.E. Lemoff et al., "MAUI: Enabling fiber-to-the-processor with parallel multiwavelength optical interconnects", J. Lightwave Technol., 22 (9):2043, Sep. 2004.
Kannan Raji et al., "'Macrochip' Computer Systems Enabled by Silicon Photonic Interconnects", Proceedings SPIE 7607, 760702, 2010.

* cited by examiner

OPTICAL INTERCONNECTION SYSTEM

The contents of the following Japanese patent application (s) are incorporated herein by reference:
NO. 2010-157151 filed on Jul. 9, 2012.

BACKGROUND

1. Technical Field

The present invention relates to an optical interconnection system. The contents of the following Japanese patent application are incorporated herein by reference,
No. 2010-157151 filed on Jul. 9, 2010

2. Related Art

Conventionally known are a surface emitting laser array device in which a plurality of surface emitting laser devices are arranged on a substrate and an optical interconnection that uses this surface emitting laser array device as a light source. In the surface emitting laser array device, each surface emitting laser device outputs a laser signal light of a different wavelength, as described in Nonpatent Documents 1 to 3 and Patent Document 1, for example. The surface emitting laser array devices used in these documents output coarse wavelength division multiplying (CWDM) light signals in which the wavelength intervals between laser signal lights are no less than approximately 5 nanometers.

An optical interconnection system is known that uses silicon photonics and includes a plurality of semiconductor integrated devices that each have an arithmetic processing unit, a modulator, an optical coupler/splitter, and a light receiving unit integrated therein, and silicon waveguides are connected between the semiconductor integrated devices to perform optical communication therebetween, as described in Nonpatent Document 4, for example. This optical interconnection system uses dense-WDM (DWDM) optical signals, in which the WDM optical signals have narrower intervals between wavelengths.

Patent Document 1: Japanese Patent Application Laid-open No. 2007-214430

Patent Document 2: Japanese Patent Application Laid-open No. 2006-351917

Nonpatent Document 1: Padullaparthi Babu Dayal, Takahiro Sakaguchi, Akihiro Matsutani, and Fumio Koyama, "Multiple-Wavelength Vertical-Cavity Surface-Emitting Lasers by Grading a Spacer Layer for Short-Reach Wavelength Division Multiplexing Applications", Appl. Phys. Express 2 (2009) 092501

Nonpatent Document 2: Suzuki Teiichi et al., "Monolithic Multiple-Wavelength VCSEL Prototype for High-Density CWDM", IEICE technical report, vol. 107, no. 198, OPE 2007-86, pp. 101-106, Aug. 8, 2007

Nonpatent Document 3: B. E. Lemoff et al., "MAUI: Enabling fiber-to-the-processor with parallel multiwavelength optical interconnects", J. Lightwave Technol., 22 (9):2043, 2004

Nonpatent Document 4: Kannan Raji et al., "'Macrochip' Computer Systems Enabled by Silicon Photonic Interconnects", Proceedings SPIE 7607, 760702, 2010

SUMMARY

However, the DWDM optical signals used by the optical interconnection systems that employ silicon photonics as described above are guided from DWDM light sources arranged outside the semiconductor integrated devices. A DWDM light source may be a combination of an optical amplifier and a DFB laser or a mode-locked semiconductor laser, for example. Therefore, the number of components and the cost increase to provide the DWDM light source, and this also increases the power consumption.

The present invention has been achieved in view of the above problems, and it is an object of the present invention to provide an optical interconnection system with fewer components, low cost, and low power consumption.

To solve the above problems, there is provided an optical interconnection system including a plurality of semiconductor integrated devices each including a surface emitting laser array device including a plurality of surface emitting laser devices each emitting an output laser signal light of a different wavelength modulated based on an input modulated signal, a silicon optical waveguide that guides output laser signal lights emitted from the surface emitting laser devices of each of the semiconductor integrated devices to another semiconductor integrated device, a plurality of optical couplers respectively corresponding to the semiconductor integrated devices and guiding the output laser signal lights to the silicon optical waveguide, and a plurality of optical splitters respectively corresponding to the semiconductor integrated devices, receiving the output laser signal lights guided by the silicon optical waveguide, and inputting an input laser signal light to a corresponding one of the semiconductor integrated devices.

Each surface emitting laser array device outputs the output laser signal light with a wavelength no less than 1.0 micrometer and no larger than 1.2 micrometers, for example. The semiconductor integrated devices, the silicon optical waveguide, the optical couplers, and the optical splitters may be disposed on the same substrate.

Each semiconductor integrated device may further include a control section that generates one of the modulated signals and controls the wavelength of the output laser signal light emitted from the surface emitting laser devices. Each semiconductor integrated device may further include a light receiving unit that receives the input laser signal light from the optical splitter, converts the received input laser signal light into a modulated current signal, and inputs the modulated current signal to the control section.

Each surface emitting laser array device outputs the output laser signal light with a different wavelength and with intervals therebetween no larger than 200 gigahertz in optical frequency, for example. Each surface emitting laser array device may include four or more surface emitting laser devices.

Each surface emitting laser device may includes an optical cavity formed by two multilayer mirrors, an active layer arranged in the optical cavity, and a wavelength adjusting layer arranged in the optical cavity and having a different thickness than a wavelength adjusting layer in another surface emitting laser device, for example. Each wavelength adjusting layer is made of a dielectric material, for example.

Each surface emitting laser device may include a heating mechanism that adjusts the wavelength of the output laser signal light output by the surface emitting laser device. Each heating mechanism includes a plurality of high-resistance heating sections corresponding to the surface emitting laser devices, and a plurality of low-resistance portions connected to the high-resistance heating sections and disposed between a pair of surface emitting laser devices, the low-resistance portions having lower electric resistance than the high-resistance heating sections, for example. Each heating mechanism may include a plurality of high-resistance heating sections and a plurality of low-resistance portions, and the high-resistance heating sections may be connected in series by the low-resistance portions.

The present invention can be used to realize an optical interconnection system with fewer components, low cost, and low power consumption.

DESCRIPTION OF EXEMPLARY EMBODIMENTS

Exemplary embodiments of an optical interconnection system according to the present invention will be described in detail below with reference to accompanying drawings. However, the embodiments should not be construed to limit the invention. All the combinations of the features described in the embodiments are not necessarily essential to means provided by aspects of the invention.

Figure 1:
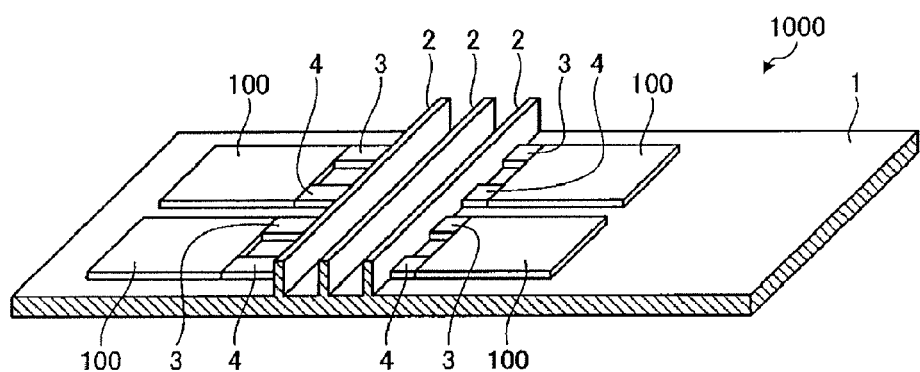
FIG. 1 is a schematic view of an optical interconnection system according to an embodiment of the present invention.

FIG. 1 is a schematic view of an optical interconnection system according to an embodiment of the present invention. As shown in FIG. 1, an optical interconnection system 1000 includes a plurality of semiconductor integrated devices 100, a plurality of silicon optical waveguides 2, and a plurality of optical couplers 3 and optical splitters 4 that connect each of the semiconductor integrated devices 100 to a predetermined one of the silicon optical waveguides 2, all formed on a silicon substrate 1. The optical couplers 3 may be provided respectively to the semiconductor integrated devices 100 to couple laser signal light to the silicon optical waveguides 2. The optical splitters 4 are provided respectively to the semiconductor integrated devices 100, receive the laser signal light guided by the silicon optical waveguides 2, and input the laser signal light to the corresponding semiconductor integrated devices 100. FIG. 1 shows four semiconductor integrated devices 100, but the optical interconnection system 1000 may include a larger number of semiconductor integrated devices 100. A center silicon optical waveguide 2 is connected to another semiconductor integrated device 100 not shown in FIG. 1.

The silicon optical waveguides 2 are ridge-shaped optical waveguides formed to protrude from the silicon substrate 1. Each silicon optical waveguide 2 guides the output laser signal light output from a corresponding one of the semiconductor integrated devices 100 to another semiconductor integrated device 100. Each silicon optical waveguide 2 may have a width of approximately 700 nanometers and a height of approximately 600 nanometers, for example. The optical couplers 3 and the optical splitters 4 may be optical filters using a ring oscillator, such as the one described in Patent Document 2.

Figure 2:
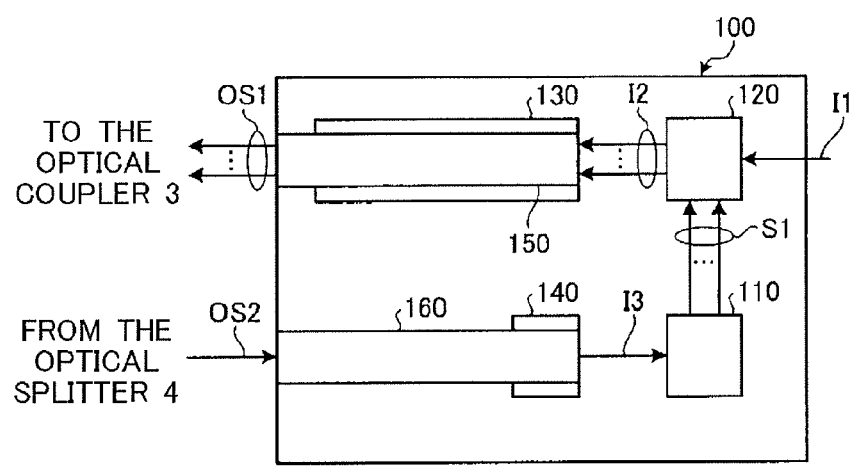
FIG. 2 is a schematic view of a semiconductor integrated device shown in FIG. 1.

The following describes the structure of the semiconductor integrated device 100. FIG. 2 is a schematic view of the semiconductor integrated device 100 shown in FIG. 1. As shown in FIG. 2, the semiconductor integrated device 100 includes an arithmetic processing unit 110, a laser driving unit 120, a surface emitting laser array device 130 including n surface emitting laser devices (n is an integer larger than one), a light receiving unit 140, an optical waveguide 150, and an optical waveguide 160. There is no particular limit on n beyond being an integer larger than 1, but n is preferably four or more since this results in high communication capacity. The optical waveguide 150 optically connects the surface emitting laser array device 130 to the optical coupler 3. The optical waveguide 160 optically connects the light receiving unit 140 and the optical splitter 4.

Figure 3:
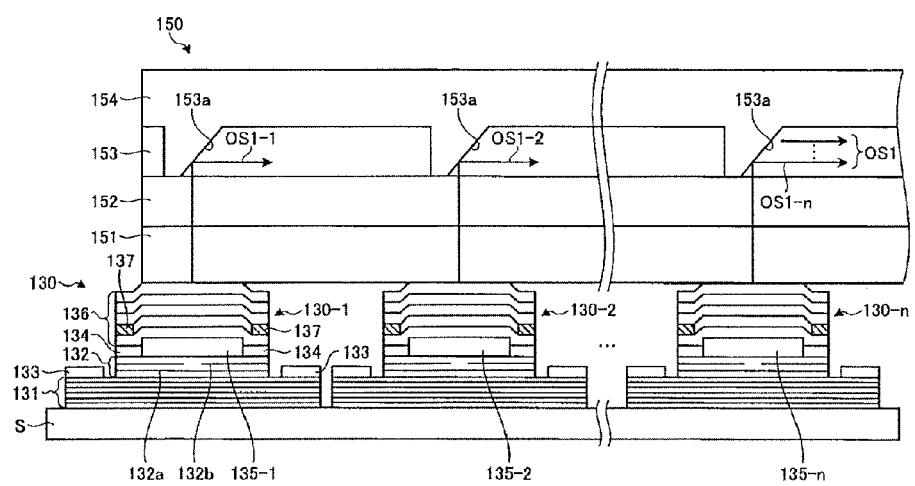
FIG. 3 is a schematic cross-sectional view of a surface emitting laser array device and an optical waveguide shown in FIG. 2, along the longitudinal direction of the optical waveguide.

The following describes structures of the surface emitting laser array device 130 and the optical waveguide 150. FIG. 3 is a schematic cross-sectional view of the surface emitting laser array device 130 and the optical waveguide 150 shown in FIG. 2, along the longitudinal direction of the optical waveguide 150. As shown in FIG. 3, the surface emitting laser array device 130 includes n surface emitting laser devices 130-1 to 130-$n$ formed on a common substrate S. FIG. 3 shows only the surface emitting laser devices 130-1, 130-2, and 130-$n$. The optical waveguide 150 is arranged to cover each of the surface emitting laser devices 130-1 to 130-$n$ of the surface emitting laser array device 130. The substrate S may be mounted on the silicon substrate 1, for example.

The following describes the structure of the surface emitting laser device 130-1. The surface emitting laser device 130-1 includes a lower DBR mirror 131, which is a lower multilayer mirror, and a semiconductor layered structure 132, formed sequentially on the substrate S. The semiconductor layered structure 132 includes an active layer 132$a$ with a multiple quantum well structure and a current confinement layer 132$b$ with a circular current injection portion in the center thereof. A p-type spacer layer and a $p^+$-type contact layer, in which the current confinement layer 132$b$ is formed, are formed on the active layer 132$a$.

A semi-annular n-side electrode 133 is formed on the surface of the lower DBR mirror 131 around the semiconductor layered structure 132. A p-side annular electrode 134 is formed on the $p^+$-type contact layer, which is the topmost surface of the semiconductor layered structure 132. A wavelength adjusting layer 135-1 and an upper DBR mirror 136, which is an upper multilayer mirror, are sequentially formed on the opening of the p-side annular electrode 134. The wavelength adjusting layer 135-1 has a wavelength adjusting function, which is described further below, and also functions as a phase adjusting layer that sets a suitable phase for nodes and anti-nodes of a standing wave of the light by being arranged between the lower DBR mirror 131 and the upper DBR mirror 136 forming the optical cavity in a manner to adjust the optical length of the optical cavity. The surface emitting laser device 130-1 further includes a high-resistance heating section 137, which is shaped as a ring with a portion thereof removed, on the p-side annular electrode 134 in the upper DBR mirror 136 to form a heating mechanism. The high-resistance heating section 137 is described in detail further below.

The other surface emitting laser devices 130-2 to 130-$n$ have structures obtained by replacing the wavelength adjusting layer 135-1 in the surface emitting laser device 130-1 with wavelength adjusting layers 135-2 to 135-$n$, respectively. The wavelength adjusting layers 135-1 to 135-n are configured to have different thicknesses. The thickness differences among the wavelength adjusting layers 135-1 to 135-n are in as small a range as from several nanometers to tens of nanometers, which is described in detail further below.

The substrate S may be made of undoped GaAs, for example. The lower DBR mirror 131 may be made of 34 pairs of GaAs/Al$_{0.9}$Ga$_{0.1}$As layers, for example. At least the topmost layer is formed of n-type GaAs to serve as a contact layer for the n-side electrode 133. The active layer 132a has a strained multiple quantum well structure obtained by alternately layering three InGaAs well layers and four GaAs barrier layers, for emitting a laser light in a wavelength range from 1.0 micrometer to 1.2 micrometers, for example. The lower DBR mirror 131 is epitaxially grown using metal organic chemical vapor deposition (MOCVD) or molecular beam epitaxy (MBE).

The bottommost GaAs barrier layer functions as an n-type cladding layer. The p-type spacer layer and the p$^+$-type contact layer of the semiconductor layered structure 132 may be respectively made of p-type and p$^+$-type GaAs doped with carbon, for example. In the current confinement layer 132b, the current injection portion may be made of AlAs with a diameter of 5 micrometers to 6 micrometers, for example, and the portion around the AlAs may be mainly made of Al$_2$O$_3$. Each p-type or n-type layer may have an acceptor or donor concentration of approximately $1\times10^{18}$ cm$^{-3}$, for example, and the p$^+$-type layers may have an acceptor concentration of $1\times10^{19}$ cm$^{-3}$ or more, for example. A lower graded-composition layer and an upper graded-composition layer of AlGaAs, for example, whose Al compositions increase monotonically as a distance to the current confinement layer 132b decreases in the thickness direction may be formed above and below the current confinement layer 132b.

The p-side annular electrode 134 may be made of Pt/Ti, for example, with an outer diameter of 30 micrometers substantially matching the circumference of the mesa post and an inner diameter of 11 micrometers to 16 micrometers, for example. The n-side electrode 133 may be made of AuGeNi/Au, for example, with an outer diameter of 80 micrometers and an inner diameter of 40 micrometers.

The wavelength adjusting layers 135-1 to 135-n may be made of a dielectric material such as silicon nitride (SiN$_x$), for example. The upper DBR mirror 136 may be made of 10 to 12 pairs of SiN$_x$/SiO$_2$, for example. The upper DBR mirror 136 may include pairs of amorphous-Si/SiO$_2$ or amorphous-Si/Al$_2$O$_3$, and the number of these pairs is selected to achieve an overall reflectivity of approximately 99%.

Since the wavelength adjusting layers 135-1 to 135-n have different thicknesses, the surface emitting laser devices 130-1 to 130-n can output laser light of different wavelengths. The wavelength interval between adjacent laser lights is no larger than 200 gigahertz, as expressed by optical frequency, and may be 100 gigahertz, for example. If the frequency interval is 100 gigahertz or less, the high-density optical transmission can be achieved and the difference in characteristics between the surface emitting laser devices 130-1 to 130-n can be decreased, and therefore frequency intervals of 100 gigahertz or less are preferable.

The following describes the structure of the optical waveguide 150. The optical waveguide 150 is formed by sequentially layering a base 151, which contacts each of the surface emitting laser devices 130-1 to 130-n of the surface emitting laser array device 130, a cladding portion 152, a core portion 153, and a cladding portion 154. The optical waveguide 150 may have a thickness of hundreds of nanometers, and is sufficiently larger than the difference in thickness between the wavelength adjusting layers 135-1 to 135-n. The height difference of the surface emitting laser devices 130-1 to 130-n caused by the height difference of the wavelength adjusting layers 135-1 to 135-n is ignorably small, and therefore the optical waveguide 150 can be stably mounted on the surface emitting laser devices 130-1 to 130-n.

The base 151, the cladding portion 152, the core portion 153, and the cladding portion 154 are each made of silica-based glass. Among these components, the core portion 153 has the highest refractive index, the cladding portion 152 and the cladding portion 154 have lower refractive indexes, and the base 151 has the lowest refractive index. The thickness of the core portion 153 and the refractive index difference between the core portion 153 and the cladding portions 152 and 154 are preferably set such that the optical waveguide 150 guides the laser light output from the surface emitting laser devices 130-1 to 130-n in a single mode.

In the core portion 153, a plurality of reflecting portions 153a are formed by groove processing at positions above each of the surface emitting laser devices 130-1 to 130-n. Each reflecting portion 153a is set to reflect the laser light output from a corresponding surface emitting laser device 130-1 to 130-n and guide the laser light into the core portion 153.

The light receiving unit 140 may be a Si/Ge photodetector, for example. In the same manner as the optical waveguide 150, the optical waveguide 160 is arranged on the light receiving unit 140 and is formed by sequentially layering a base, a cladding portion, a core portion, and a cladding portion. The core portion includes a reflecting portion that reflects the light guided thereto by the optical waveguide 160 and inputs the reflected light to the light receiving unit 140.

The following describes the operation of the optical interconnection system, with reference to FIGS. 1 to 3. The arithmetic processing unit 110 of the semiconductor integrated device 100 functions as a control section that generates a modulated signal to control the wavelengths of the laser signal lights emitted from the surface emitting laser devices 130-1 to 130-n. The arithmetic processing unit 110 performs computation according to instructions from an external source, and inputs to the laser driving unit 120 a voltage signal S1 that includes differential voltage signals and that is modulated by an amplitude of plus-minus 100 millivolts, for example, to include information concerning the computation results. The laser driving unit 120 is supplied with a bias current I1 from an external unit and superimposes the voltage signal S1 on the bias current I1, and inputs to the surface emitting laser array device 130 a current signal I2 that includes n modulated current signals.

In the surface emitting laser array device 130, the n modulated current signals included in the current signal I2 are respectively supplied to the surface emitting laser devices 130-1 to 130-n to which the modulated current signals are allocated in advance. The surface emitting laser devices 130-1 to 130-n respectively output laser signal lights OS1-1 to OS1-n of different wavelengths that are directly modulated by the input modulated current signals. The laser signal lights OS1-1 to OS1-n output from the surface emitting laser devices 130-1 to 130-n and input to the core portion 153 are reflected at the reflecting portions 153a of the optical waveguide 150 and guided by the optical waveguide 150, preferably in the single mode. The optical waveguide 150 outputs a laser signal light OS1, which is a high-density DWM signal light including the n laser signal lights OS1-1 to OS1-n, to the optical coupler 3. The optical coupler 3 inputs the laser signal light OS1 to the silicon optical waveguide 2.

The silicon optical waveguide 2 guides the laser signal light OS1, preferably in the single mode.

The optical splitter 4 can separate laser light of a specific wavelength from the silicon optical waveguide 2 allocated in advance from among the laser signal lights OS1-1 to OS1-$n$. As a result, as shown in FIG. 2, the semiconductor integrated device 100 receives, from the optical splitter 4, a laser signal light OS2 that is allocated thereto in advance and output from another semiconductor integrated device 100. The optical waveguide 160 guides the laser signal light OS2 to the light receiving unit 140. The light receiving unit 140 converts the laser signal light OS2 into a modulated current signal I3 that includes predetermined differential voltage signals, and inputs the modulated current signal I3 to the arithmetic processing unit 110.

In this manner, each semiconductor integrated device 100 uses the laser signal light OS1 as a DWDM signal light to send and receive computation results to and from another semiconductor integrated device 100 via the silicon optical waveguide 2, thereby realizing a high-speed optical interconnection system. In particular, in the optical interconnection system 1000 of the present embodiment, each semiconductor integrated device 100 directly modulates the surface emitting laser array device 130 integrated therein, and uses this as a light source for communication. Accordingly, the resulting optical interconnection system 1000 has fewer components, low power consumption, and low cost.

In the optical interconnection system 1000 of the present embodiment, the wavelengths of the laser signal lights OS1-1 to OS1-$n$ output by the surface emitting laser devices 130-1 to 130-$n$ are adjusted to be different from each other by changing the thicknesses of the wavelength adjusting layers 135-1 to 135-$n$, whose thicknesses can be adjusted with a high degree of accuracy. As a result, it is possible to obtain the laser signal light OS1 as a DWDM signal light with high accuracy and high density.

Figure 4:
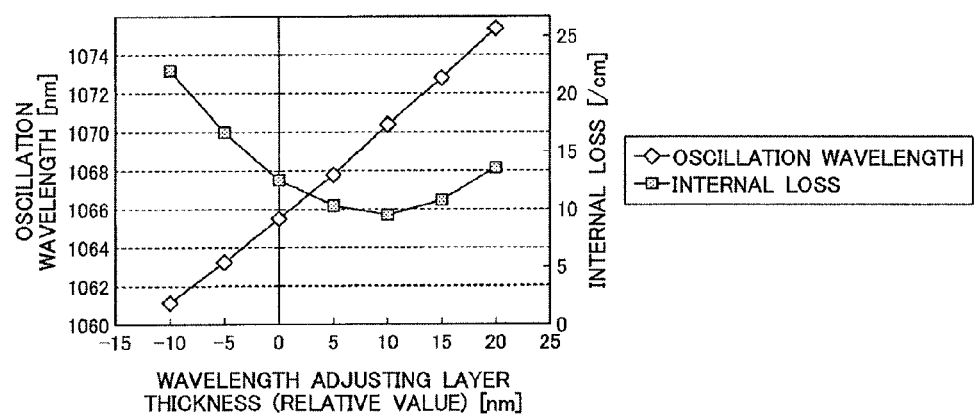
FIG. 4 shows an exemplary relationship between thickness of a wavelength adjusting layer and laser oscillation wavelength and internal loss.

FIG. 4 shows an exemplary relationship between the thickness of a wavelength adjusting layer and the laser oscillation wavelength and internal loss in a surface emitting laser device with the structure shown in FIG. 3. The thickness of the wavelength adjusting layer is shown as a relative thickness with respect to the thickness of the wavelength adjusting layer in a predetermined surface emitting laser device. As shown in FIG. 4, the laser oscillation wavelength of the surface emitting laser device can be adjusted in a range of about 14 nanometers from 1061 nanometers to 1075 nanometers by changing the thickness of the wavelength adjusting layer in a range of 30 nanometers from −10 nanometers to 20 nanometers.

In FIG. 4, the thicknesses of the layers of the lower DBR mirror or the upper DBR mirror of the surface emitting laser device, for example, are optimized for a specific laser light wavelength, which is approximately 1066 nanometers in the example shown in FIG. 4. In the example shown in FIG. 4, because the laser oscillation wavelength is adjusted by changing only the thickness of the wavelength adjusting layer, the internal loss in the optical cavity increases as a difference between the laser oscillation wavelength and the optimized wavelength mentioned above increases. Accordingly, this increase of the internal loss is preferably considered when setting the wavelength adjustment range. For example, in FIG. 4, if the maximum tolerable increase from the minimum value of the internal loss is 15/cm, the wavelength adjustment range is about 14 nanometers in a range from 1061 nanometers to 1075 nanometers. In the wavelength band of 1.1 micrometers, the intervals of 200 gigahertz between optical frequencies correspond to 0.7 nanometers in wavelengths.

Accordingly, approximately 20 channels of laser signal lights can be arranged at frequency intervals of 200 gigahertz within the wavelength adjustment range of about 14 nanometers.

Figure 5:
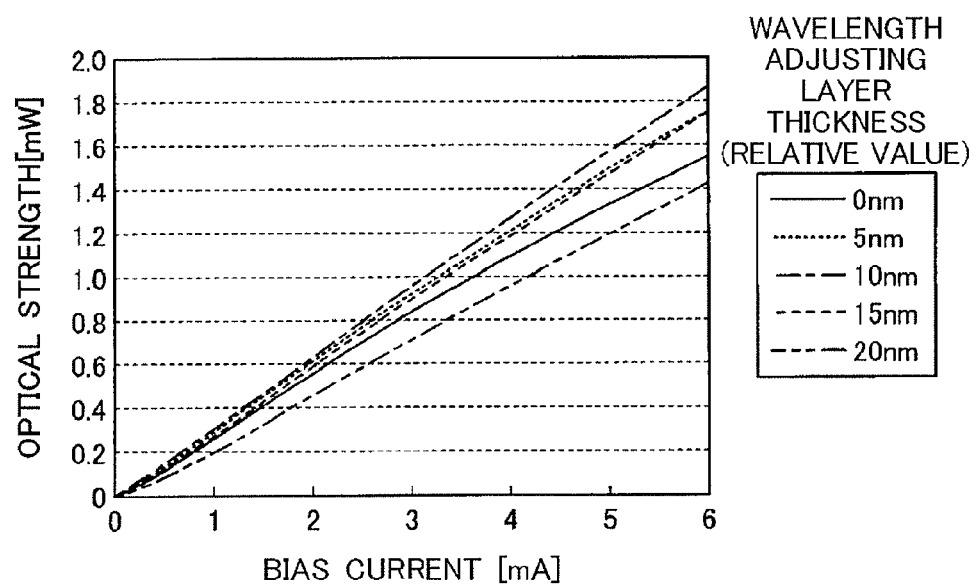
FIG. 5 shows an exemplary relationship between bias current and optical intensity of laser light.

FIG. 5 shows an exemplary relationship between bias current and laser light intensity in five surface emitting laser devices of which the relative thicknesses are changed in a range from 0 nanometers to 20 nanometers, based on FIG. 4. Although the laser oscillation wavelengths of the surface emitting laser devices are distributed in a range of about 10 nanometers in FIG. 4, a laser light with stable intensity and good linearity with respect to the bias current can be output at any wavelength in a broader range.

The thicknesses of the wavelength adjusting layers 135-1 to 135-$n$ can be adjusted with high accuracy by adjusting the etching time for the wavelength adjusting layers 135-1 to 135-$n$ when manufacturing the surface emitting laser devices 130-1 to 130-$n$. Therefore, the wavelengths of the laser signal lights OS1-1 to OS1-$n$ can also be adjusted with high accuracy to achieve the predetermined frequency intervals.

Figure 6:
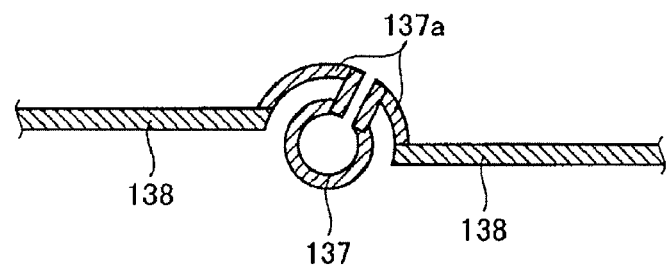
FIG. 6 is a schematic plan view of a heating mechanism provided in each surface emitting laser device.

The following describes a heating mechanism provided in each of the surface emitting laser devices 130-1 to 130-$n$ shown in FIG. 2. FIG. 6 is a schematic plan view of the heating mechanism provided in each of the surface emitting laser devices 130-1 to 130-$n$. As shown in FIG. 6, the heating mechanism includes the high-resistance heating section 137, which is partly cutaway ring shaped and arranged on the p-side annular electrode 134 in the upper DBR mirror 136, and a low-resistance portion 138, which is connected to the high-resistance heating section 137 via an arm portion 137$a$ and has lower electric resistance than the high-resistance heating section 137. The low-resistance portion 138 is joined to the high-resistance heating section in the adjacent surface emitting laser device via the arm portion. The low-resistance portion 138 may be provided between each of the surface emitting laser devices 130-1 to 130-$n$ shown in FIG. 3. For example, the low-resistance portion 138 may be provided between a high-resistance heating section 137-1 of the surface emitting laser device 130-1 shown in FIG. 3 and a high-resistance heating section 137-2 of the surface emitting laser device 130-2.

The high-resistance heating section 137 and the arm portion 137$a$ may be made of platinum (Pt) thinfilm with a width of 5 micrometers and a thickness of 100 nanometers, for example. The low-resistance portion 138 may be made of relatively thick gold (Au) thinfilm with a width of 10 micrometers and a thickness of 2 micrometers, for example. An insulating layer may be provided between the low-resistance portion 138 and the n-side electrode.

The heating mechanisms are for adjusting the laser light oscillation wavelengths of the surface emitting laser devices 130-1 to 130-$n$ in a collective manner. Because the temperature of the active layer 132$a$ in each of the surface emitting laser devices 130-1 to 130-$n$ is increased by current flowing to the high-resistance heating section 137 via the low-resistance portion 138 of the heating mechanism, the laser oscillation wavelength is changed. The coefficient of the change in the laser oscillation wavelength with respect to the temperature increase is approximately 0.067 nanometers per degree Celsius when the active layer 132$a$ is made of GaAs-based material such as InGaAs, which is a semiconductor material used for a laser light in a wavelength band of 1.1 micrometers. The high-resistance heating section 137 may be positioned closer to the active layer 132$a$ than to the center of the upper DBR mirror 136 in the layer direction, for example. By positioning the high-resistance heating section 137 near the active layer 132$a$, the heating efficiency is improved.

Since the high-resistance heating sections 137 in the surface emitting laser devices 130-1 to 130-n are connected in series by the low-resistance portions 138, when current flows via the low-resistance portion 138, the temperature of each of the high-resistance heating sections 137 increases by the same amount. As a result, the shift amount of the laser oscillation wavelength of each of the surface emitting laser devices 130-1 to 130-n is the same. Accordingly, by using these heating mechanisms, the laser oscillation wavelengths of the surface emitting laser devices 130-1 to 130-n can be adjusted in a collective manner. If the laser oscillation wavelengths are adjusted in this way, the configuration of the current control circuit becomes simpler than a case in which each surface emitting laser device is adjusted individually.

Figure 7:
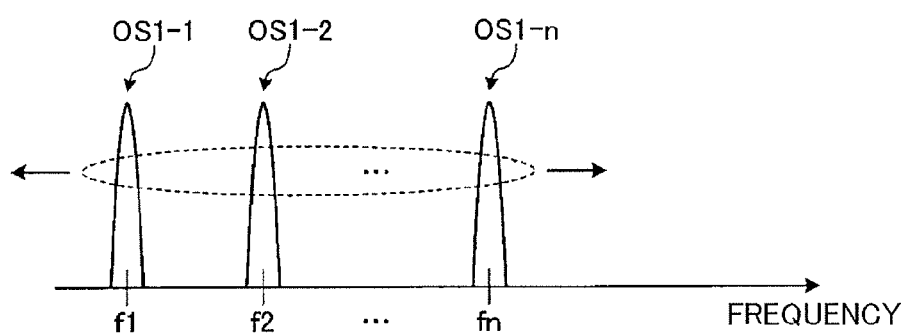
FIG. 7 is a diagram for explaining a method for collective adjustment of laser oscillation wavelengths.

FIG. 7 is a diagram for explaining a method for collective adjustment of the laser oscillation wavelengths. In FIG. 7, reference numerals f1 to fn represent a frequency grid arranged at regular intervals on the frequency axis. The laser signal lights OS1-1 to OS1-n of the surface emitting laser devices 130-1 to 130-n can be adjusted with high accuracy by adjusting the thicknesses of the wavelength adjusting layers to achieve the frequency intervals of the frequencies f1 to fn. If the power consumed by the heating mechanisms is adjusted based on FIG. 8, it is possible to match the wavelengths of the laser signal lights OS1-1 to OS1-n with the frequency grid f1 to fn by shifting the wavelengths in a collective manner.

Figure 8:
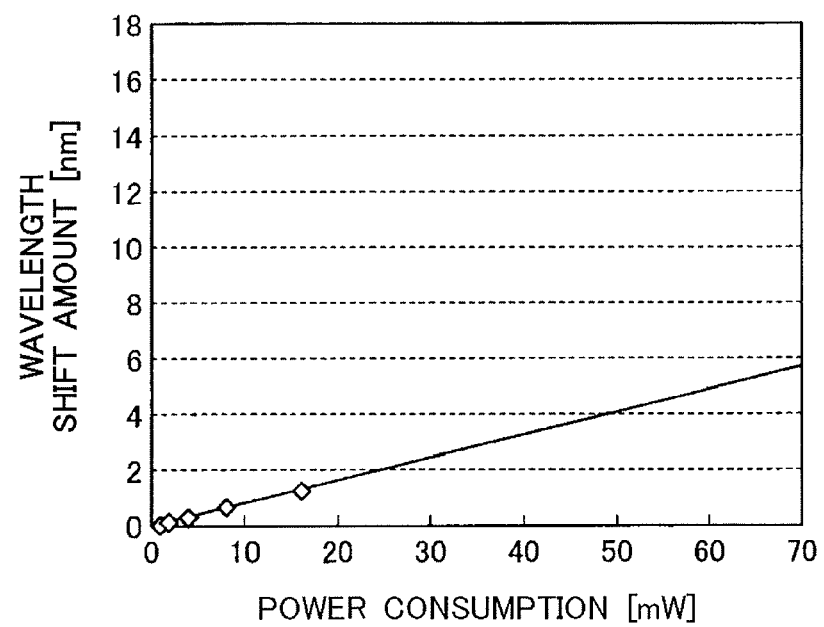
FIG. 8 shows an exemplary relationship between power consumption of the heating mechanism shown in FIG. 6 and wavelength shift amount.

FIG. 8 shows an exemplary relationship between power consumption of the heating mechanism shown in FIG. 6 and shift amount of the laser oscillation wavelength. As shown in FIG. 8, the laser oscillation wavelength can be shifted at about 1.5 nanometers per 20 milliwatts of power consumption.

In the above embodiment, a system with low loss can be realized because the laser oscillation wavelength of the surface emitting laser device becomes out of the optical absorption band of silicon, which is in a wavelength band below 1 micrometer, and the optical absorption band of GaAs, which is in a wavelength band of 0.85 micrometers if the laser oscillation wavelength is no less than 1.0 micrometer and no larger than 1.2 micrometers. Furthermore, in the above embodiment, an InGaAs-strained multiple quantum well structure with good characteristics can be used for the active layer of the surface emitting laser device, and therefore the power consumption of the surface emitting laser device can be decreased.

The structures of the semiconductor integrated device, surface emitting laser device, heating mechanism, etc. in the above embodiment are merely examples. In the optical interconnection system of the present invention, known semiconductor integrated devices, surface emitting laser devices, heating mechanisms, etc. can be used as appropriate. For example, the heating mechanism may be formed as a heater pattern on the surface of the upper DBR mirror.

1 silicon substrate
2 silicon optical waveguide
3 optical coupler
4 optical splitter
100 semiconductor integrated device
110 arithmetic processing unit
120 laser driving unit
130 surface emitting laser array device
130-1 to 130-n surface emitting laser device
131 lower DBR mirror
132 semiconductor layered structure
132a active layer
132b current confinement layer
133 n-side electrode
134 p-side annular electrode
135 wavelength adjusting layer
136 upper DBR mirror
137 high-resistance heating section
137a arm portion
138 low-resistance portion
140 light receiving unit
150, 160 optical waveguide
151 base
152, 154 cladding portion
153 core portion
153a reflecting portion
1000 optical interconnection system

What is claimed is:

1. An optical interconnection system comprising:
a plurality of semiconductor integrated devices each including a surface emitting laser array device including a plurality of surface emitting laser devices each emitting an output laser signal light of a different wavelength modulated based on an input modulated signal;
a silicon optical waveguide that guides output laser signal lights emitted from the surface emitting laser devices of each of the semiconductor integrated devices to another semiconductor integrated device;
a plurality of optical couplers respectively corresponding to the semiconductor integrated devices and guiding the output laser signal lights to the silicon optical waveguide; and
a plurality of optical splitters respectively corresponding to the semiconductor integrated devices, receiving the output laser signal lights guided by the silicon optical waveguide, and inputting an input laser signal light to a corresponding one of the semiconductor integrated devices,
wherein the plurality of semiconductor integrated devices are connected to share the silicon optical waveguide.

2. The optical interconnection system according to claim 1, wherein each surface emitting laser array device outputs the output laser signal light with a wavelength no less than 1.0 micrometer and no larger than 1.2 micrometers.

3. The optical interconnection system according to claim 1, wherein the semiconductor integrated devices, the silicon optical waveguide, the optical couplers, and the optical splitters are disposed on a same substrate.

4. The optical interconnection system according to claim 1, wherein each of the semiconductor integrated devices further includes a control section that generates the modulated signal and controls wavelengths of output laser signal lights emitted from the surface emitting laser devices.

5. The optical interconnection system according to claim 4, wherein each of the semiconductor integrated devices further includes a light receiving unit that receives the input laser signal light from the optical splitter, converts received input laser signal light into a modulated current signal, and inputs modulated current signal to the control section.

6. The optical interconnection system according to claim 1, wherein each surface emitting laser array device outputs the output laser signal light with a different wavelength with an interval of 200 gigahertz or lower in optical frequency.

7. The optical interconnection system according to claim 1, wherein each surface emitting laser array device includes four or more surface emitting laser devices.

8. The optical interconnection system according to claim 1, wherein each of the surface emitting laser devices includes an optical cavity formed by two multilayer mirrors, an active layer arranged in the optical cavity, and a wavelength adjusting layer arranged in the optical cavity with a different thickness than a wavelength adjusting layer in another surface emitting laser device.

9. The optical interconnection system according to claim 8, wherein each wavelength adjusting layer is made of dielectric material.

10. The optical interconnection system according to claim 1, wherein each of the surface emitting laser devices includes a heating mechanism that adjusts a wavelength of the output laser signal light output from the surface emitting laser device.

11. The optical interconnection system according to claim 10, wherein each heating mechanism includes
   a high-resistance heating section provided in each of the surface emitting laser devices, and
   a low-resistance portion connected to the high-resistance heating section and disposed between surface emitting laser devices, the low-resistance portion having lower electric resistance than the high-resistance heating section.

12. The optical interconnection system according to claim 11, wherein
   each heating mechanism includes a plurality of high-resistance heating sections and a plurality of low-resistance portions, and
   the high-resistance heating sections are connected in series by the low-resistance portions.

* * * * *